United States Patent [19]
Maruyama et al.

[11] 3,984,722
[45] Oct. 5, 1976

[54] PHOTOCONDUCTIVE TARGET OF AN IMAGE PICKUP TUBE AND METHOD FOR MANUFACTURING THE SAME

[75] Inventors: Eiichi Maruyama, Kodaira; Hiroaki Hachino, Hitachi; Yasushi Saitoh, Mobara; Tadaaki Hirai, Koganei; Naohiro Goto; Yukinao Isozaki, both of Machida; Keiichi Shidara, Tama; Saiichi Koizumi, Tokyo, all of Japan

[73] Assignees: Hitachi, Ltd.; Nippon Hoso Kyokai, both of Japan

[22] Filed: May 14, 1974

[21] Appl. No.: 469,760

[30] Foreign Application Priority Data
May 21, 1973  Japan................ 48-55716

[52] U.S. Cl................... 313/386; 313/94
[51] Int. Cl.² ............... H01J 29/45; H01J 31/38
[58] Field of Search .......... 313/94, 385, 386, 384

[56]  References Cited
UNITED STATES PATENTS

| | | | |
|---|---|---|---|
| 2,654,853 | 10/1953 | Weimer | 313/385 X |
| 3,238,062 | 3/1966 | Sunners et al. | 313/385 X |
| 3,517,241 | 6/1970 | Goto et al. | 313/94 X |
| 3,571,646 | 3/1971 | Kiuchi et al. | 313/94 |
| 3,685,989 | 8/1972 | Galen | 313/385 |
| 3,890,525 | 6/1975 | Hirai et al. | 313/386 |

FOREIGN PATENTS OR APPLICATIONS
45-6176  1970  Japan................ 313/94

OTHER PUBLICATIONS
Gombay et al, Chem Abstracts; vol. 75, 1971; 43098d.

*Primary Examiner*—Robert Segal
*Attorney, Agent, or Firm*—Craig & Antonelli

[57]   ABSTRACT

An image pickup tube target wherein a rectifying contact which is formed at a boundary of a first layer of a material selected from the group consisting of tin oxide, indium oxide, titanium oxide, cadmium sulfide, zinc sulfide, cadmium selenide, zinc selenide, n-type germanium, n-type silicon and mixture thereof, and a second layer of a material mainly consisting of selenium and including halogen, is reversely biased and operated at a region where signal current is saturated with respect to applied voltage. The second layer of the material includes 50 atomic percent or more of selenium and 0.1 – 1000 atomic ppm of halogen. More preferably, the second layer comprises 3–20 atomic % of arsenic, 0.1–20 atomic ppm of iodine and balance mainly consisting of selenium.

27 Claims, 4 Drawing Figures

PHOTOCONDUCTIVE TARGET OF AN IMAGE PICKUP TUBE AND METHOD FOR MANUFACTURING THE SAME

The present invention relates to a photoconductive target of an image pickup tube, and more particularly to an image pickup tube target utilizing a rectifying contact formed between a layer of non-crystalline photoconductive material mainly consisting of selenium and other material, and to a method for manufacturing the same.

As photoconductive materials to be used for the image pickup tube target, antimony trisulfide, lead oxide, silicon or the like have been known. Among these materials, antimony trisulfide has been used as a photoconductive target of ohmic contact type, while lead oxide and silicon have been used as photoconductive targets of p-n junction type or rectifying contact type. The targets of p-n junction type and rectifying contact type are operated in reverse-biased conditions of p-n junction or rectifying contact of a semiconductor device and it has been known that the target of this type was advantageous in that it had a small dark current and excellent lag characteristic.

It has been already suggested by certain of the inventors of the present invention in the U.S. Pat. Application Ser. No. 308,677 that a noncrystalline photoconductive material mainly consisting of selenium generally exhibits p-type conductivity and forms an excellent rectifying contact with many n-type materials such as tin oxide, indium oxide, titanium oxide, cadmium sulfide, zinc sulfide, cadmium selenide, zinc selenide, n-type germanium, n-type silicon or the like, and that a target having a small dark current and excellent lag characteristics can be obtained by using these materials in an image pickup tube target.

In the target constructed in accordance with the above-mentioned application, when a constant light signal is directed from the side of a light-transmitting substrate while positively biasing a transparent electrode with respect to a cathode by a voltage supplied from a D.C. power supply, a signal current flows through a load resistance. The relationship between the applied voltage, i.e. the target voltage and the signal current is described below. When the light signal is being directed to the target, as the target voltage increases, the signal current first increases and saturates at a point, and thereafter the signal current slowly increases, as the target voltage increases, resulting in a plateau in a curve until it reaches a breakdown voltage.

The plateau region is referred to as a saturation region of the signal current. In order to enable distinct observation of the saturation region, it is desirable that the incident light is a blue light having a wavelength around 400 m$\mu$. When the saturation region is exceeded, the current flowing through the load resistor abruptly increases because the dark current abruptly increases. In such a region the S/N ratio of the signal current decreases and the lag characteristic and the after image tend to be deteriorated so that preferable characteristics for the image pickup target cannot be obtained. Also, when the target of this structure is used in a region before reaching the saturation region, a sufficient signal current is not produced and the lag characteristics and the after image are remarkably deteriorated. Accordingly, in order for the target of this structure to exhibit excellent characteristics as an rectifying contact, it must be operated in the saturation region of the signal current.

Furthermore, even within the saturation region, if the target voltage is too high, secondary electrons are generated from a surface of the target due to scanning electron beam, which results in inconvenience such as distortion in a picked-up image. In order to reduce the distortion, there is provided a secondary electron emission inhibiting layer formed of a porous film of antimony trisulfide or arsenic triselenide. However, considering the balance with a peripheral circuit of the image pickup tube, it is not preferable to set the target voltage of the image pickup tube too high. It is therefore desirable in the image pickup tube of this type to obtain excellent lag characteristics and after image at a target voltage within the saturation region and to prevent the emission of the secondary electrons by causing the saturation point to appear at a sufficiently low target voltage region.

The above requirement has not been satisfied by the image pickup tube target of the above-mentioned structure.

It is, therefore, an object of the present invention to provide an image pickup tube having a saturation point at a sufficiently low target voltage region, and a method for manufacturing the same.

It has been found by the inventors of the present invention that the voltage at which the saturation point appears greatly varies with a slight amount of halogen contained in a non-crystalline photoconductive material mainly consisting of selenium. When halogen is contained in said photoconductive material, the saturation point of the signal current shifts to a lower voltage. Thus, such a target can provide excellent lag characteristics and after image, even if it is operated at a relatively low target voltage region. However, when the amount of halogen contained in the non-crystalline photoconductive material layer becomes excessive, the breakdown voltage for the dark current also shifts to a lower target voltage and the saturation region of the signal current is narrowed. This adversely affects on the characteristics of the image pickup tube. When the amount of halogen is less than 0.1 ppm, a threshold voltage for the signal current exceeds 40 volts, and when the amount of halogen exceeds 1,000 ppm, the breakdown voltage is less than 30 volts and the dark current increases. Thus, in any event undesirable conditions for the image pickup tube are observed. Accordingly, the amount of halogen suitable for the present invention is within the range of 0.1 – 1000 ppm. A particularly suitable halogen is iodine and its concentration is 0.1–20 atomic ppm. For adding such a slight amount of halogen to selenium, a predetermined amount of halogen in the form of simple substance or compound may be added to pure selenium. The mixture thus obtained is then heated and melted in a quartz ampoule and then cooled and solidified. The resulting material is added to pure selenium in a similar manner. In this way the halogen content can be diluted to a desired concentration. In order to determine the halogen content added to selenium, spark source type mass analysis or radioactivation analysis may be effective.

As a composition of the non-crystalline photoconductive material layer mainly consisting of selenium, in addition to selenium and a slight amount of halogen, 1 – 40 atomic percent of arsenic to prevent the crystallization of selenium and 1 – 30 atomic percent of tellurium to enhance the sensitivity to red light may be contained. Elements other than tellurium that are effective to enhance the sensitivity to red light are antimony, bismuth, cadmium, lead or the like. In any case, however, when total amount of added elements other than selenium exceeds 50 atomic percent, the rectifying characteristic of the contact formed between the non-crystalline photoconductive material layer and the n-type material layer is deteriorated and the dark current increases.

Preferred examples of the present invention will now be described. In the examples, the amount of constituent elements are represented by atomic percent. It should be understood that the image pickup tube targets constructed in accordance with the following examples are not restrictive but many modifications thereof can be made.

EXAMPLE 1

Pure selenium and 0.1% of iodine with respect to selenium are sealed in a quartz ampoule and evacuated to $3 \times 10^{-6}$ Torr while being cooled. Thereafter, they are heated and mixed in an electric furnace at 600° C for 5 hours. Then the ampoule is taken out into the air in order that the content in it is rapidly cooled and solidified. The ampoule is then broken to remove the content, to which pure selenium is added with a ratio of 100 parts of selenium to 1 part of the content. They are melted and mixed in another quartz ampoule under the similar conditions to those stated above and then rapidly cooled and solidified. To selenium containing 10 ppm of iodine thus prepared are added 10% of arsenic and 10% of tellurium and they are sealed in another evacuated quartz ampoule, heated and melted therein at 800° C for 5 hours and then rapidly cooled and solidified. Material consisting of selenium, iodine, arsenic and tellurium is vacuum deposited from a tantalum boat to a thickness of 3 microns at $5 \times 10^{-6}$ Torr vacuum. Antimony trisulfide is further vacuum deposited thereon to a thickness of 1000 A under argon pressure of $1 \times 10^{-2}$ Torr to form an image pickup tube target.

Figure 1:
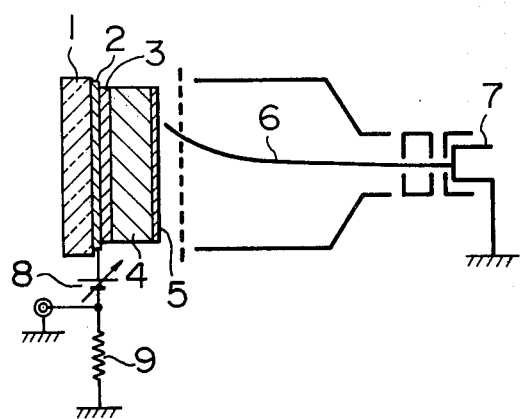
FIGS. 1 and 2 are sectional views of the structures of image pickup tubes including targets in accordance with the present invention.
Figure 2:
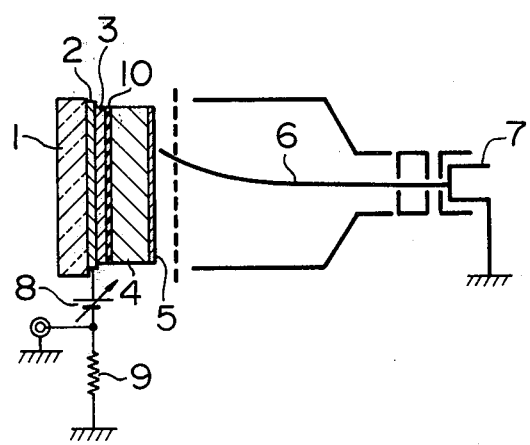

FIG. 1 illustrates a vidicon type image pickup tube having a target utilizing a rectifying contact between a non-crystalline photoconductive material layer mainly consisting of selenium thus prepared and an n-type material, wherein 1 designates a transparent target substrate, 2 a transparent electrode, 3 an n-type material layer, 4 a non-crystalline photoconductive material layer mainly consisting of selenium, 5 a secondary electron emission inhibiting layer, 6 a scanning electron beam and 7 an cathode. Material that may be used as the n-type material layer 3 may be certain oxides, sulfides and selenides as shown previously, but the n-type material layer 3 may also act as the transparent electrode 2 when electric conductivity of the layer 3 is considerably high. Examples of the n-type material layer 3 that may also act as the transparent electrode 2 are tin oxide, indium oxide, titanium oxide, n-type germanium and n-type silicon. In such a rectifying contact type target, in order to increase reverse-biased breakdown voltage, an insulating layer 10 of several hundreds A thickness, as shown in FIG. 2, such as a magnesium fluoride layer may be interposed between the n-type material layer 3 and the photoconductive material layer 4 mainly consisting of selenium. In such a case, however, there is no essential difference in operation from that of the target constructed in accordance with FIG. 1.

In the target structure shown in FIG. 1, when a constant light signal is directed from a side of the transparent substrate 1 while the transparent electrode 2 is positively biased with respect to the cathode 7 by a voltage supplied from a D.C. power supply 8, a signal current flows through a load resistor 9. This is a principle of operation of the present image pickup tube. The relationship between the applied voltage, i.e., the target voltage and the signal current is shown in FIG. 3.

Figure 3:
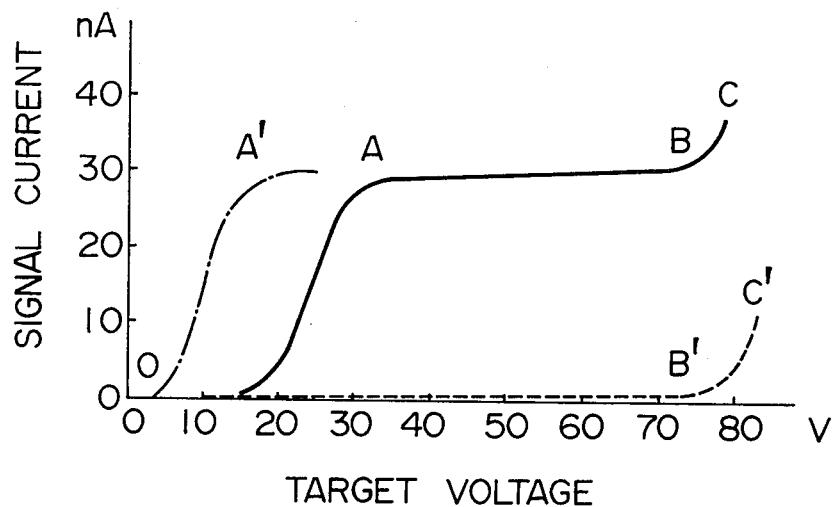
FIG. 3 is a chart showing the relationship between a target voltage and a signal current of a target in accordance with the present invention.

In FIG. 3, the curve OABC represents typical signal current — voltage characteristics when the light signal is directed to the target. As the target signal increases, the signal current increases along the curve OA and saturates at point A. Thereafter, when the target voltage is increased, the signal current increases only slightly and a plateau portion of the curve continues until point B is reached. This plateau portion AB is a saturation region of the signal current. Beyond the saturation region, the current flowing through the load resistor 9 begins to increase along the curve BC. This is because a dark current OB'C' rapidly increases in this voltage range. When the target voltage is lower than that corresponding to the point A, that is, in the region of the curve OA in FIG. 3, a sufficient signal current is not produced and the lag characteristics and after image are remarkably deteriorated. Accordingly, in order for the target of the present structure to exhibit excellent characteristics of an rectifying contact, it must be operated within the saturation region of the signal current or the region of the curve AB in FIG. 3. Furthermore, even if it is operated in the region of the curve AB, when the target voltage is too high, secondary electron beams are generated from a surface of the target by the scanning electron beam 6 in FIG. 1 resulting in distortion in a picked-up image or reversal of brightness. Also, considering the balance with peripheral circuits of the image pickup tube, it is not desirable to set the target voltage of the image pickup tube too high.

In the target of the present structure, when non-crystalline pure selenium is used for the photoconductive material 4, the selenium is altered from non-crystalline to crystalline in a short time period at a relatively low temperature of 30° – 50° C resulting in rapid increase in the dark current to lose the function as the image pickup tube. In order to prevent such a phenomenon, it is effective to use selenium containing arsenic of 30 atomic % or less as the photoconductive material 4. In this case, since the saturation point A in FIG. 3 varies between 15 and 70 volts depending upon selenium and arsenic materials used, it is not possible to construct the image pickup tubes having the saturation point of 15 – 30 volts and excellent lag characteristics and after image with high reproducibility. The voltage at which the saturation point A of FIG. 3 appears depends on a slight amount of halogen contained in the selenium - arsenic non-crystalline photoconductive material layer 4, and it is possible to shift the curve OA to OA' by controlling the amount of halogen between 0.1 – 1000 atomic ppm.

The addition of halogen has been investigated further in detail by the inventors of the present invention to find that (1) the effect of the addition of halogen is remarkably recognized particularly when selenium — arsenic photoconductive material is used, (2) as halogen, iodine is the easiest to be dealt with industrially and thus the saturation point A of FIG. 3 can be controlled with good reproducibility, and (3) a target material which enables to control the saturation point A of FIG. 3 within the most preferable voltage region of 15 – 30 volts while maintaining the dark current at very small value can be prepared by adding 0.1 – 20 atomic ppm of iodine to non-crystalline photoconductive material layer 4 mainly consisting of selenium and containing 3 – 20 atomic percent of arsenic.

Figure 4:
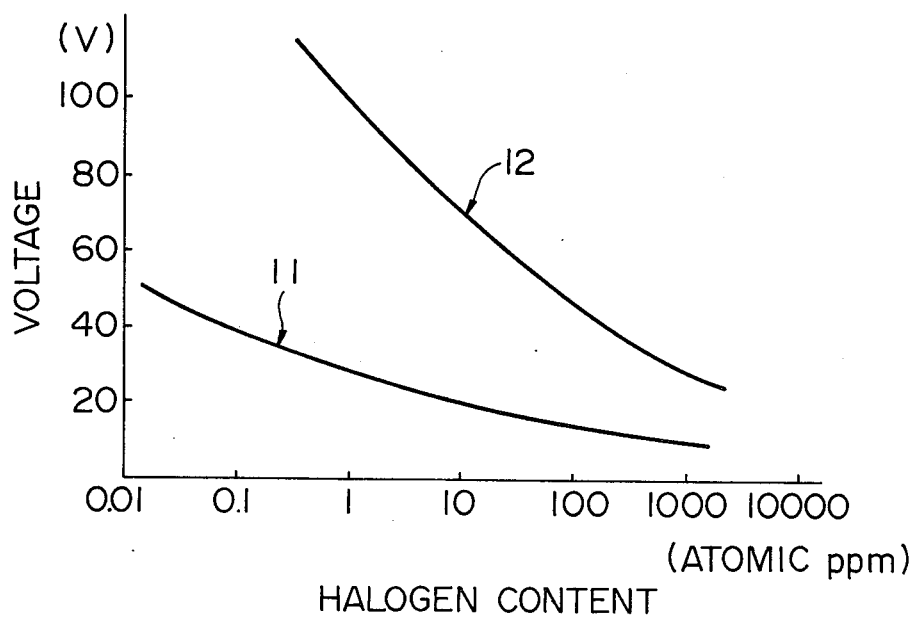
FIG. 4 is a chart showing the relationship between the amount of halogen contained in a non-crystalline photoconductive material layer mainly consisting of selenium and a threshold voltage of a signal current as well as a breakdown voltage.

In FIG. 4 curve 11 shows the relationship between the amount of halogen contained in the selenium — arsenic non-crystalline photoconductive material 4 and the voltage at the saturation point A of the signal current shown in FIG. 3 and curve 12 shows the relationship between said amount of halogen and the breakdown voltage at which the dark current begins to increase abruptly. From this Figure it can be seen that the concentration region of halogen giving the most preferable target voltage is from 0.1 to 1000 ppm.

EXAMPLE 2

Pure selenium and an amount of selenium tetrachloride corresponding to 0.1% Cl are sealed in a quartz ampoule and the content are melted and mixed in the same way as Example 1. The resulting material is then diluted with pure selenium in the same manner as Example 1 to prepare selenium containing 10 ppm of chlorine. To the selenium thus prepared, an amount of arsenic corresponding to 5% As is added in the same manner as Example 1 to prepare a mixture of selenium — arsenic — chlorine. Cadmium selenide is vacuum deposited to a thickness of 500 A on a glass substrate provided with a transparent electrode of indium oxide at a substrate temperature of 200° C, on which said selenium — arsenic — chlorine mixture is vacuum deposited to a thickness of 4 microns using a molybdenum boat while maintaining the substrate temperature at room temperature. Simultaneously with the vacuum deposition of the selenium — arsenic — chlorine mixture, antimony is evaporated by another molybdenum boat to allow 7% of antimony to be uniformly doped in a film of selenium — arsenic — chlorine mixture. On the film thus prepared, arsenic triselenide is vacuum deposited to a thickness of 2000 A in the presence of low pressure argon of $5 \times 10^{-3}$ Torr to form an image pickup tube target in the same manner as Example 1.

EXAMPLE 3

Pure selenium and an amount of lead bromide corresponding to 0.1% Br are sealed in a quartz ampoule and the content is mixed and diluted in the same way as Example 1, and arsenic is added thereto in the similar manner as Example 1 to prepare selenium — arsenic — bromine material containing 20 ppm of bromine and 13% of arsenic. On an n-type silicon wafer having a resistivity of 10 Ωcm and a thickness of 15 microns, said selenium — arsenic — bromine material is vacuum deposited to a thickness of 1 micron under vacuum condition of $5 \times 10^{-6}$ Torr, on which antimony trisulfide is vacuum deposited in the presence of low pressure argon of $5 \times 10^{-3}$ Torr to form an image pickup tube target.

The image pickup tubes prepared in accordance with the above three examples show the saturation of signal current at a target voltage 20 – 30 volts which is lower than that for an image pickup tube prepared in a same manner but without addition of halogen, and they exhibit excellent lag characteristics and after image at a low target voltage. Although the above examples do not illustrate the use of fluorine, it has been found that a similar result can be obtained by using fluorine.

It should be understood that various modifications that can be readily conceived from the teaching of the present invention such as to divide the non-crystalline photoconductive material layer 4 containing selenium into two or more layers having different compositions, to adopt the system to cyclically superimpose several hundreds to several thousands of constituent layers of different thickness of several to several tens A from two or more evaporation sources, or to impart non-uniformity to the distribution of the additive elements other than halogen in the normal direction to the target, are all included in the scope of the present invention.

What is claimed is:

1. An image pickup tube target wherein a rectifying contact formed at a boundary between a first material layer of a material selected from a group consisting of tin oxide, indium oxide, titanium oxide, cadmium sulfide, zinc sulfide, cadmium selenide, zinc selenide, n-type germanium, n-type silicon and mixtures thereof and a second non-crystalline material layer containing 50 atomic percent or more of selenim and 0.1 – 1000 atomic ppm of halogen is reversely biased and operated to a region in which a signal current is saturated with respect to applied voltage.

2. A photoconductive image pickup tube target according to claim 1 wherein said second material layer consists of 3 – 20 atomic percent of arsenic, 0.1 – 20 atomic ppm of iodine and balance consisting essentially of selenium.

3. An image pickup tube target comprising a transparent substrate; a first layer of n-type semiconductor material deposited on said substrate and formed of a material selected from the group consisting of tin oxide, indium oxide, titanium oxide, n-type germanium, n-type silicon and mixtures thereof; and a second layer of non-crystalline material deposited on said first layer containing at least 50 atomic percent of selenium and 0.1 – 1000 atomic ppm of a halogen.

4. A image pickup tube target as defined in claim 3 wherein said second layer further contains 3 – 40 atomic percent arsenic.

5. An image pickup tube target as defined in claim 4 wherein said second layer consists essentially of 3 – 20 atomic percent arsenic, 0.1 – 20 atomic ppm iodine and the balance consisting essentially of selenium.

6. An image pickup tube target as defined in claim 4 wherein said second layer consists essentially of 13 atomic percent arsenic, 20 atomic ppm bromine and the balance consisting essentially of selenium.

7. An image pickup tube target as defined in claim 6, further including a third layer of antimony trisulfide deposited on said second layer.

8. An image pickup tube target as defined in claim 4 wherein said second layer further contains 1 – 30 atomic percent of a red light sensitivity enhancing material selected from the group consisting of tellurium, antimony, bismuth, cadmium and lead.

9. An image pickup tube target as defined in claim 8 wherein said second layer consists of 10 atomic percent arsenic, 10 atomic percent tellurium, 10 atomic ppm iodine and the balance consisting essentially of selenium.

10. An image pickup tube target as defined in claim 9, further including a third layer of antimony trisulfide deposited on said second layer.

11. An image pickup tube target as defined in claim 1 wherein a layer of indium oxide is interposed between said first and second layers.

12. An image pickup tube target as defined in claim 8 wherein said second layer comprises of 5 atomic percent arsenic, 7 atomic percent antimony, 10 atomic ppm chlorine and the balance consisting essentially of selenium.

13. An image pickup tube target as defined in claim 12, further including a third layer of arsenic triselenide deposited on said second layer.

14. An image pickup tube target as defined in claim 13 wherein a layer of indium oxide is interposed between said first and second layers.

15. An image pickup tube target comprising a transparent substrate; a transparent conductive electrode deposited on said substrate; a first layer of n-type semiconductor material deposited on said transparent conductive electrode and formed of a material selected from the group consisting of tin oxide, indium oxide, titanium oxide, n-type germanium, n-type silicon, cadmium sulfide, zinc sulfide, cadmium selenide and mixtures thereof; and a second layer of non-crystalline material deposited on said first layer containing at least 50 atomic percent of selenium and 0.1 – 1000 atomic ppm of a halogen.

16. An image pickup tube target as defined in claim 15 wherein said second layer further contains 3 – 40 atomic percent arsenic.

17. An image pickup tube target as defined in claim 16 wherein said second layer consists of 3 – 20 atomic percent arsenic, 0.1 – 20 atomic ppm iodine and the balance consisting essentially of selenium.

18. An image pickup tube target as defined in claim 16 wherein said second layer consists essentially of 13 atomic percent arsenic, 20 atomic ppm bromine and the balance consisting essentially of selenium.

19. An image pickup tube target as defined in claim 18, further including a third layer of antimony trisulfide deposited on said second layer.

20. An image pickup tube target as defined in claim 16 wherein said second layer further contains 1 – 30 atomic percent of a red light sensitivity enhancing material selected from the group consisting of tellurium, antimony, bismuth, cadmium and lead.

21. An image pickup tube target as defined in claim 20 wherein said second layer consists of 10 atomic percent arsenic, 10 atomic percent tellurium, 10 atomic ppm iodine and the balance consisting essentially of selenium.

22. An image pickup tube target as defined in claim 21, further including a third layer of antimony trisulfide deposited on said second layer.

23. An image pickup tube target as defined in claim 15 wherein a layer of indium oxide is interposed between said first and second layers.

24. An image pickup tube target as defined in claim 20 wherein said second layer consists essentially of 5 atomic percent arsenic, 7 atomic percent antimony, 10 atomic ppm chlorine and the balance consisting essentially of selenium.

25. An image pickup tube target as defined in claim 24 wherein said first layer consists essentially of cadmium selenide.

26. An image pickup tube target as defined in claim 25, further including a third layer consisting essentially of arsenic triselenide deposited on said second layer.

27. An image pickup tube target as defined in claim 26 wherein a layer of indium oxide is interposed between said first and second layers.

* * * * *